United States Patent [19]

Bailey et al.

[11] 4,168,467
[45] Sep. 18, 1979

[54] MEASUREMENT OF PULSE DURATION

[76] Inventors: Andrew T. J. Bailey; Roy W. Vanlint, both of The Pinnacles, Harlow, Essex CH19 5BB, England

[21] Appl. No.: 870,165

[22] Filed: Jan. 17, 1978

[30] Foreign Application Priority Data

Jan. 18, 1977 [GB] United Kingdom ................. 1948/77

[51] Int. Cl.$^2$ ............................................... G04F 8/00
[52] U.S. Cl. .................................. 324/187; 324/83 D
[58] Field of Search .................... 324/187, 83 D, 186; 331/166, 116 R; 250/214 R; 328/129

[56] References Cited

U.S. PATENT DOCUMENTS

| | | | |
|---|---|---|---|
| 2,665,410 | 1/1954 | Burbeck | 324/187 |
| 3,325,750 | 6/1967 | O'Hern et al. | 324/187 |
| 3,611,134 | 10/1971 | McDowell | 324/187 |

Primary Examiner—M. Tokar
Attorney, Agent, or Firm—Robert F. O'Connell

[57] ABSTRACT

A method and apparatus are disclosed for measuring the duration of unknown pulses in which measurement resolution is determined from adjacent first and second clock pulse frequencies provided by continuously running oscillators in which the first clock pulses trigger the unknown pulses, and the second clock pulses occurring within the unknown pulses are counted to measure unknown pulse duration.

5 Claims, 4 Drawing Figures

MEASUREMENT OF PULSE DURATION

PRIOR ART

A search carried out among U.S. patent specifications revealed the following art as of interest:

| | | |
|---|---|---|
| 2,738,461 | Burbeck | March 13, 1956 |
| 3,325,750 | O'Hern | June 13, 1967 |
| 3,505,594 | Hornoch | April 7, 1970 |
| 3,611,134 | McDowell | October 5, 1971 |
| 3,781,665 | Gale | December 25, 1973 |
| 3,909,712 | Rietz | September 30, 1975 |
| 3,911,358 | Shalyt | October 7, 1975 |
| 3,931,502 | Kohlas | January 6, 1976 |

The closest reference is considered to be U.S. Pat. No. 3,325,750 which is discussed below.

The present invention relates to a method and apparatus for measuring the duration of pulses which are capable of being triggered repetitively. An example of such pulses is those provided by cable fault locating equipment and representing the time taken for a test pulse to propagate to and from a reflecting fault in a cable under test.

It is well known to measure the duration of unknown pulses by counting the number of clock pulses occurring during the pulse whose duration is being measured. The period of the clock pulses must obviously then be short enough to achieve the desired resolution of measurement. In the case of cable fault locating, the pulse whose duration is to be measured may be as short as 1 us and a 1% resolution of measurement then requires a clock pulse frequency of 100 MHz to give a period of 10 ns. While digital circuits capable of operating at such a frequency are available, they are relatively expensive and consume substantial power, making battery operation problematic. Portable cable fault locating equipment is preferably battery-powered.

The present invention employs a circuit which will measure a pulse duration to a resolution smaller than the period of clock signals employed in the circuit. This enables cheaper circuitry to be employed in the main and power consumption can also be substantially reduced. For example, a resolution of 1 ns can be achieved using mainly CMOS circuitry which is inherently capable of operation only up to say, 1 MHz.

Thus, using clock pulses with closely adjacent frequencies $f_1$ and $f_2$, a resolution equal to the difference between $1/f_1$ and $1/f_2$ is achieved by an electrical application of the well known vernier principle, as disclosed in U.S. Pat. No. 3,325,750. In this prior specification, the measurement is made from a single unknown pulse which requires the two clock oscillators to be started by the beginning and end of the unknown pulse respectively. This is disadvantageous in that problems with jitter can occur and the object of the present invention is to allow the clock oscillators to run continuously.

According to the invention in one aspect, there is provided a method of measuring the duration of unknown pulses, employing first and second clock pulses having closely adjacent frequencies $f_1$ and $f_2$, whereby the resolution of measurement is the difference between $1/f_1$ and $1/f_2$, characterised in that the first clock pulses are employed to trigger repetitively the unknown pulses and in that edges of predetermined sense of the second clock pulses which occur within one of the unknown pulses are counted to measure the duration.

Further according to the invention, there is provided apparatus for measuring the duration of unknown pulses, employing first and second clock pulses having closely adjacent frequencies $f_1$ and $f_2$, whereby the resolution of measurement is the difference between $1/f_1$ and $1/f_2$, comprising a first oscillator providing a signal at $f_1$ to an output terminal for connection to a source of pulses of unknown duration, an input terminal for receiving these pulses, and a coincidence circuit responsive to a second oscillator providing a signal at $f_2$ and to the pulses on the input terminal to be enabled to pass a pulse to a counter each time an edge of predetermined sense of $f_2$ is coincident with one of the said pulses.

The said predetermined edges slip (in a sense depending upon which of the first and second clock pulses has the greater frequency) by an amount t per cycle of the first pulses, t being given by the difference between $1/f_1$ and $1/f_2$ where $f_1$ and $f_2$ are the frequencies of the first and second clock pulses. By making $f_1$ and $f_2$ sufficiently close to each other, t can be made very much shorter than either $1/f_1$ or $1/f_2$. The slip of the edges has the effect that only a number N of the edges will coincide with pulses whose duration is being measured where Nt is the said duration, which is thus measured to a resolution of t.

Clearly, unless the period of a single measurement is restricted to a value T not more than the reciprocal of the difference frequency between $f_1$ and $f_2$, the coincidence of edges with pulses whose duration is being measured will re-occur and a double counting situation will arise. To avoid this happening, a further pulse of duration T may be derived from the beat frequency of $f_1$ and $f_2$ and the gating circuit can be enabled only during the presence of the further pulse to establish a measurement interval during which counting of the measurement pulses is possible. The measurement interval could be determined in other ways, e.g., by the use of a one-shot circuit with a set time not exceeding T. However, it is possible to make the measurement over a period nT and divide the result by n to determine the time pulse duration. This technique will average any noise present in the system, and give greater accuracy.

It will be apparent that use of the circuit according to the invention presupposes that the duration of the pulses to be measured remains constant over the measurement interval.

An embodiment of the invention will now be described, by way of example, utilizing numerical values appropriate to measuring short pulse durations such as arise in cable fault locating. In the accompanying drawings.

Figure 1:
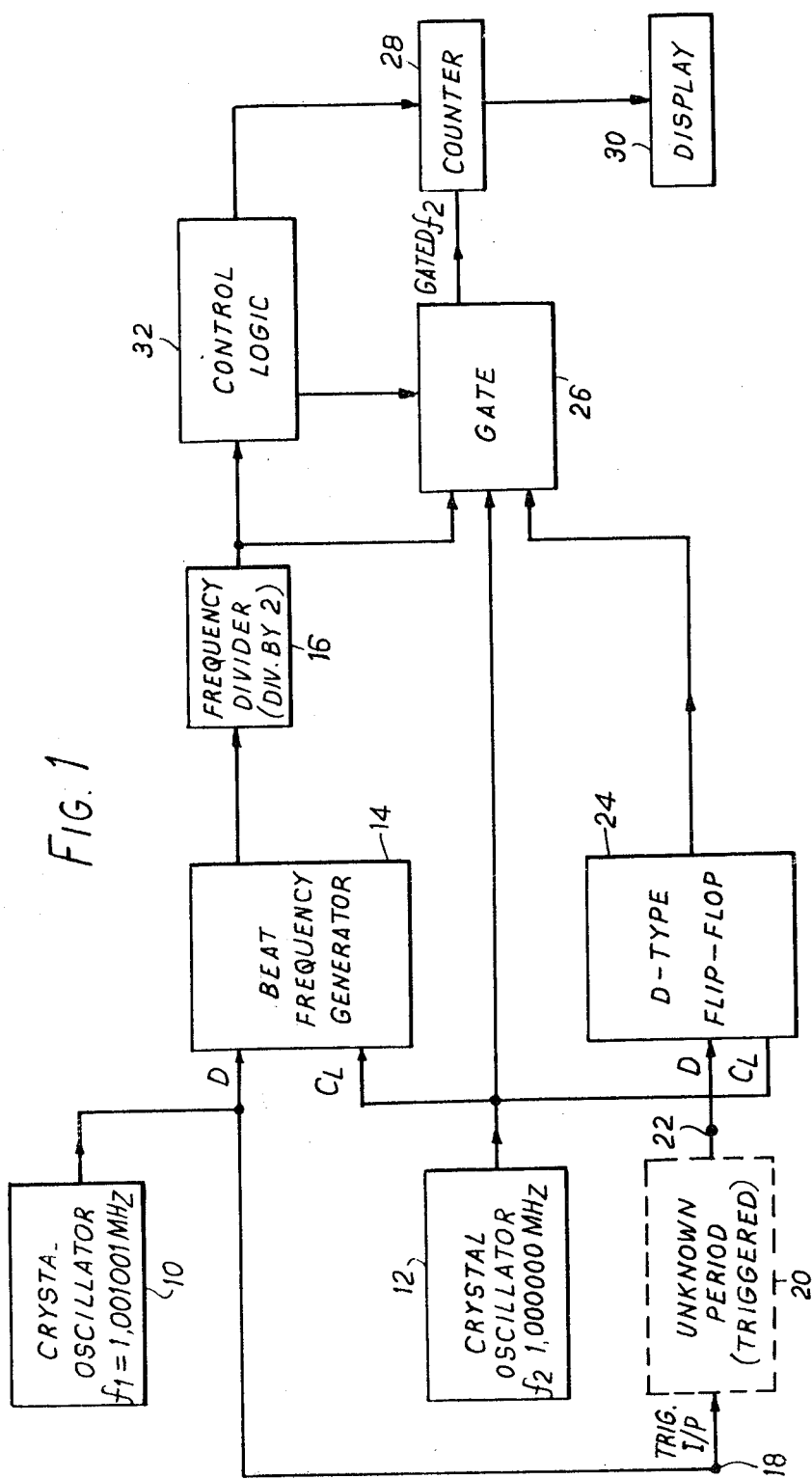
FIG. 1 is a block diagram of the said embodiment.

The circuit shown in FIG. 1 comprises a first crystal oscillator 10 operating at a frequency $f_1$ of 1.001001 MHz and a second crystal oscillator 12 operating at a frequency $f_2$ of 1.000000 MHz. The value of t (see above) is therefore 1 μs−0.999 μs, i.e., 1 ns. It should be noted that the absolute stability requirements of the oscillators are not excessive. Small variations of $f_1$ and $f_2$ are permissible provided t remains substantially constant and this can be achieved using matched crystals in the two oscillators. Waveforms (a) and (b) in FIG. 2 show the clock signals at $f_2$ and $f_1$ respectively, while the time t is denoted in relation to waveform (b).

Figure 2:
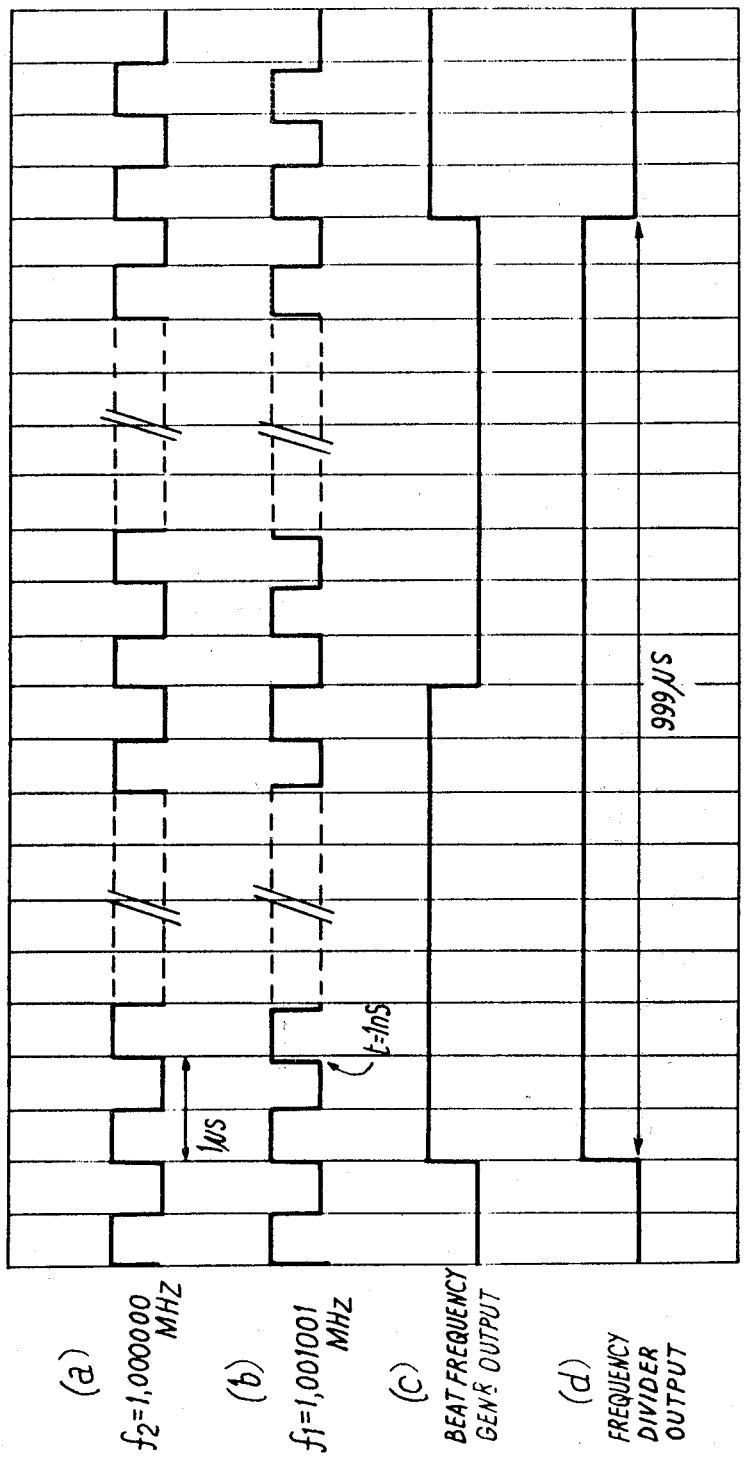
FIGS. 2, 3 and 4 show explanatory waveforms.

The signals at $f_1$ and $f_2$ are applied to a beat frequency generator 14 which provides a signal at the difference frequency $f_1-f_2$ shown at waveform (c) in FIG. 2. The beat frequency generator may be a D-type flip-flop with $f_1$ applied to the D input and $f_2$ to the clock input. The difference frequency is actually 1.001 KHz. and will yield a period for the waveform (c) of 999 μs. A divide-by-two flip-flop 16 provides a pulse of 999 μs duration shown in FIG. 2 as waveform (d) and this pulse establishes the duration T of the measurement interval.

An output terminal 18 is provided for applying the $f_1$ pulses as trigger pulses to a circuit 20, such as a known cable fault locator, which responds with pulses having an unknown duration and referred to as unknown pulses. The unknown pulses are received at an input terminal 22. This terminal is connected to the D input of a D-type flip-flop 24 which is clocked by the $f_2$ pulses. The D-type flip-flop copies the state of the unknown pulse at the instants of the rising edges of $f_2$.

FIG. 3 again shows the $f_2$ and $f_1$ signals at (a) and (b) and shows an example of the unknown pulse at (c) with an assumed very short duration of 5 ns. The leading edge of each unknown pulse is coincident with a rising edge of $f_1$ because $f_1$ triggers the unknown pulses. The rising edges of $f_2$ are shown at $t_1$, $t_2$, etc. At $t_1$, the flip-flop 24 is set because the unknown pulse goes true at this instant. The unknown pulse remains true at $t_2$, $t_3$, $t_4$ and $t_5$ but is slipping back 1 ns per cycle of $f_2$ because of the 1 ns per cycle slip between $f_2$ and $f_1$. Therefore, at $t_6$ the unknown pulse is going false as the edge of $f_2$ rises and the flip-flop 24 is reset.

Figure 3:
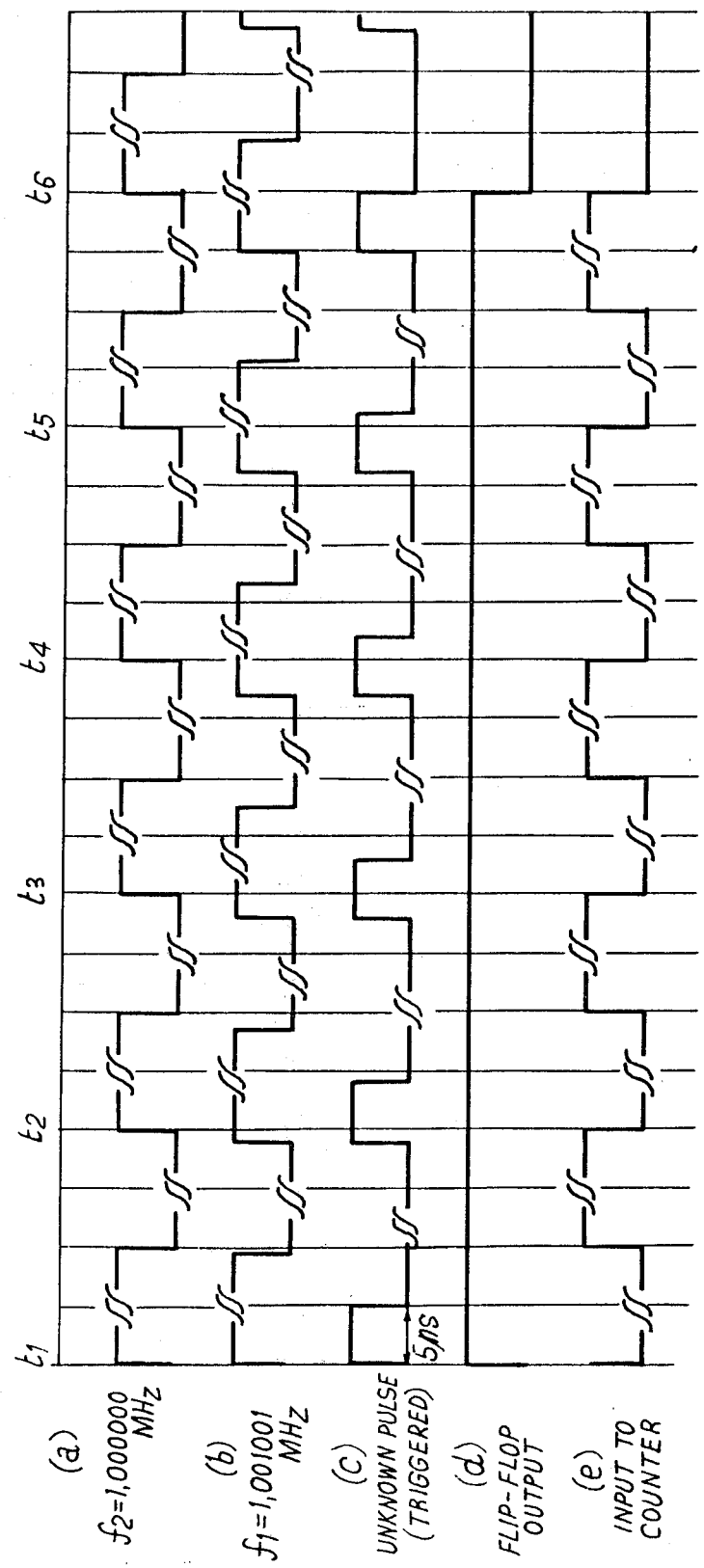

The output of the flip-flop is thus a pulse of duration equal to five cycles of $f_2$ as shown at (d) in FIG. 3. This pulse is applied as one input to a gate 26 which receives as other inputs the $f_2$ signal and the signal (d) of FIG. 2 from the flip-flop 16. In the example under consideration, the gate 26 passes five $f_2$ pulses an measurement pulses indicating that the duration of the unknown pulses is 5×t, i.e., 5 ns. The output of the gate 26 is waveform (e) in FIG. 3 shown inverted relative to $f_2$ on the assumption that a NAND gate is employed. The flip-flop 24 and gate 16 form a gating circuit responsive to the rising edges of $f_2$ and to the unknown pulses and also to the $f_2$ pulses themselves to pass the measurement pulses shown at (e) in FIG. 3.

Figure 4:
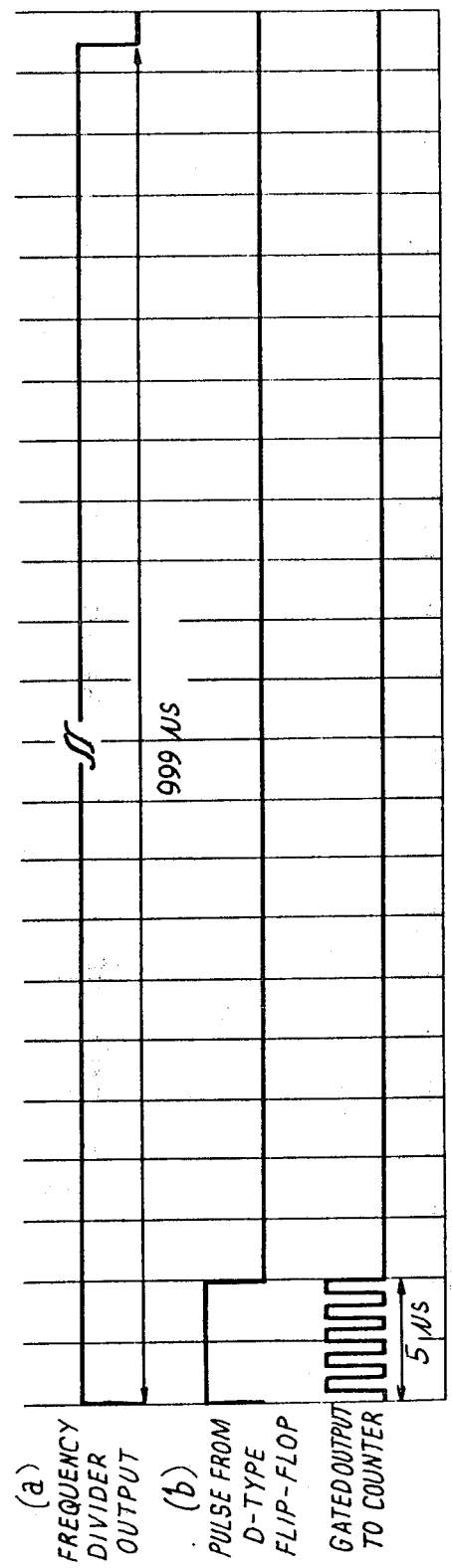

FIG. 4 again shows at (a) the 999 μs pulse from the flip-flop 16. Waveform (b) is the pulse from the D-type flip-flop 24 and waveform (c) shows the pulses passed by the gate 26. These pulses are applied to a counter 28 which counts the value of N, this being displayed by a conventional display device 30.

Some form of control logic 32 is provided as is customary for instruments which make repetitive measurements. In the simplest case the control logic need merely reset the counter in response to each rising edge of the output from the flip-flop 16. The display 30 would then need to buffer the counter contents which could be loaded into a buffer register on each falling edge of the output from the flip-flop 16. Alternatively, the control logic could allow only one measurement to be made and held in the counter 28 whenever a front panel switch was pressed. Other techniques well known in digital instruments of this nature could be employed.

In spite of the fact that a 1 ns resolution is achieved, there are no frequencies anywhere in the circuit greater than 1.001001 MHz and, with one exception, the whole circuit of FIG. 1 can be constructed from commercially available CMOS circuits which are relatively cheap and require little operating power. The exception is the flip-flop 24 which has to be very fast acting if the 1 ns accuracy is to be maintained. This one component can be implemented using circuits of sufficient speed, e.g., TTL logic.

As described, the readout on the display device 30 is a measurement in nanoseconds. Known techniques can be used to scale the digital readout to give a measurement in terms of some other quantity such as meters. The invention could be used in connection with equipment other than cable fault locating equipment, e.g., sonar systems where the duration of the unknown pulses is changing sufficiently slowly to be effectively constant over the measurement interval.

We claim:

1. In a method of measuring the duration of unknown pulses, employing first and second clock pulses having closely adjacent frequencies $f_1$ and $f_2$, whereby the resolution of measurement is the difference between $1/f_1$ and $1/f_2$: the improvement wherein the first and second pulses are provided by continuously running oscillators, wherein the first clock pulses are employed to trigger repetitively the unknown pulses and wherein edges of predetermined sense of the second clock pulses which occur within one of the unknown pulses are counted to measure the duration.

2. A method according to claim 1, wherein the counting is allowed to take place only within a measurement interval derived from the reciprocal of the difference frequency between $f_1$ and $f_2$.

3. Apparatus for measuring the duration of unknown pulses, employing first and second clock pulses having closely adjacent frequencies $f_1$ and $f_2$, whereby the resolution of measurement is the difference between $1/f_1$ and $1/f_2$, comprising a first continuously running oscillator providing a signal at $f_1$ to an output terminal for connection to a source of pulses of unknown duration, an input terminal for receiving these pulses, a second continuously running oscillator providing a signal at $f_2$, a counter and a coincidence circuit responsive to the signal $f_2$ and the pulses on the input terminal to be enabled to pass a pulse to the counter each time an edge of predetermined sense of $f_2$ is coincident with one of the said pulses.

4. Apparatus according to claim 3, wherein the coincidence circuit comprises a bistable circuit clocked by $f_2$ to copy the state of the input terminal, and a gating circuit arranged to gate $f_2$ through to the counter when a bistable circuit is in the state corresponding to pulse present at the input terminal.

5. Apparatus according to claim 4, further comprising a beat frequency generator responsive to $f_1$ and $f_2$ to provide a signal at the difference frequency $f_1 \sim f_2$, and a frequency divider dividing the frequency of the difference frequency to provide a signal which disables the gating means after an interval equal to $N/(f_1 \sim f_2)$, where N is an integer at least equal to 2.

* * * * *